United States Patent

[11] 3,587,002

[72] Inventor Christopher Robin Brown
Ipswich, Suffolk, England
[21] Appl. No. 844,737
[22] Filed July 22, 1969
[45] Patented June 22, 1971
[73] Assignee Ransomes Sims & Jefferies Limited

[54] VOLTAGE-CONTROLLED TRANSISTOR MULTIVIBRATOR
9 Claims, 1 Drawing Fig.

[52] U.S. Cl. .......... 331/113R, 331/177 R, 332/14
[51] Int. Cl. .......... H03k3/282, H03k 7/06
[50] Field of Search .......... 331/113, 177, 144, 145; 332/14

[56] References Cited
UNITED STATES PATENTS
3,445,788 5/1969 Camenzind .......... 331/113

*Primary Examiner*—Roy Lake
*Assistant Examiner*—Siegfried H. Grimm
*Attorney*—Ira Milton Jones ABSTRACT: A monostable or free-running transistor multivibrator is provided with semiconductor means for varying the period of conduction of one or both of the transistors forming the multivibrator in dependence upon a control voltage by varying the rate of discharge of the capacitor of the resistor-capacitor network whose time constant governs the period of conduction of the transistor. In one form of the invention the semiconductor means comprises an NPN transistor the collector-emitter path of which is in series with the capacitor of the associated resistor capacitor network, the control voltage being applied, directly or indirectly, to the base of the NPN transistor.

PATENTED JUN 22 1971 3,587,002
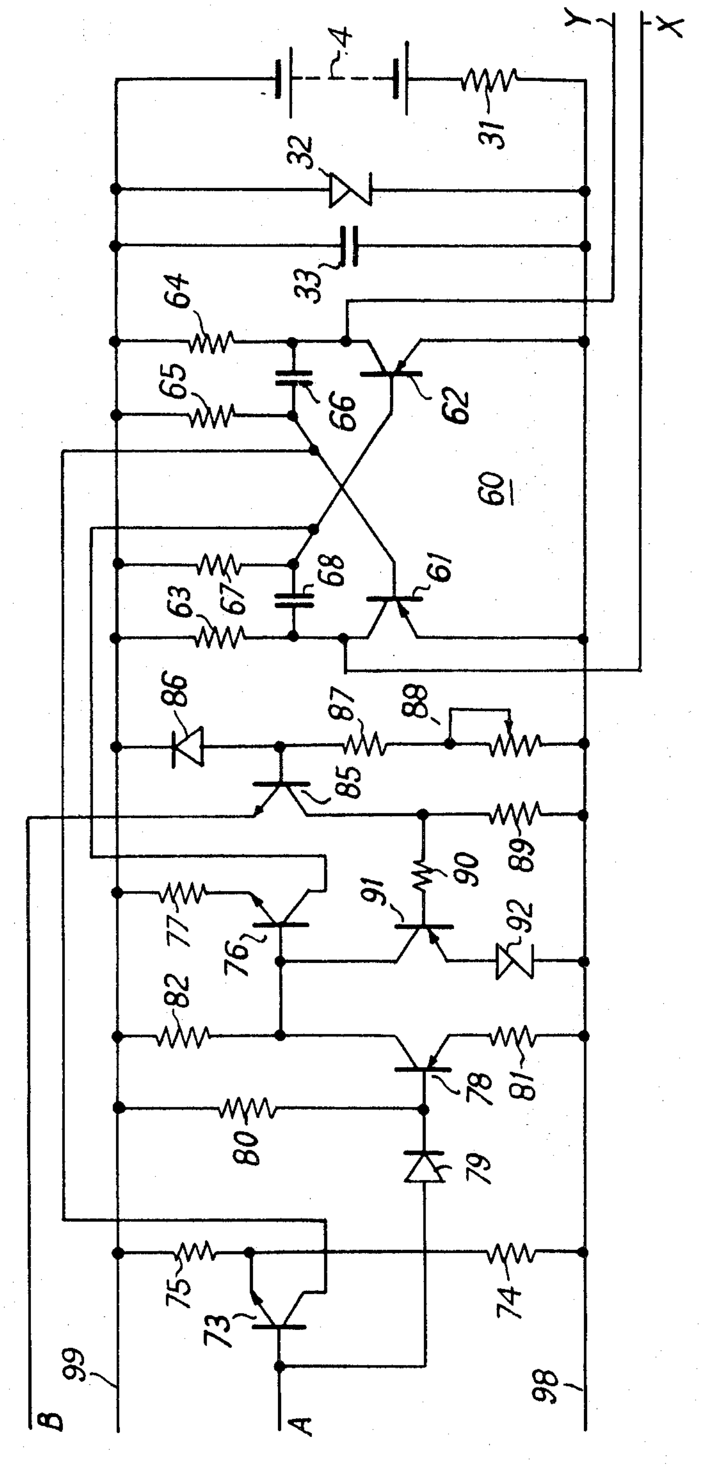
INVENTOR
Christopher Robin Brown
BY Ira Milton Jones
ATTORNEY

VOLTAGE-CONTROLLED TRANSISTOR MULTIVIBRATOR

This invention relates to multivibrators of the kind including first and second transistors at least one of which has connected therewith a resistor -capacitor network the time constant of which governs the period of conduction of the associated transistor.

According to this invention there is provided a multivibrator of the kind set forth, wherein there are provided semiconductor means connected with the resistor-capacitor network and operable, in dependence upon a control voltage applied to the transistor means, to vary the rate of discharge of the capacitor of the resistor-capacitor network, whereby the period of conduction of the associated transistor is varied.

In one form of the invention, the multivibrator is of the free-running (or astable) kind having first and second resistor-capacitor networks respectively connected with the first and second transistors, wherein there are provided first and second semiconductor means connected respectively with the first and second resistor-capacitor networks, each semiconductor means being operable, in dependence upon a control voltage applied thereto, to vary the rate of discharge of the capacitor of the associated resistor-capacitor network, whereby the period of conduction of the associated transistor is varied. In this case the first and second semiconductor means may be operable in dependence upon the same control voltage, the first semiconductor means being rendered increasingly heavily conducting upon rise in the control voltage thereby to discharge more rapidly the capacitor of the first resistor-capacitor network, while the second semiconductor means is rendered less heavily conducting upon rise in the control voltage thereby less rapidly to discharge the capacitor of the second resistor-capacitor network.

The invention will now be described, by way of example, with reference to the accompanying drawing, which is a circuit diagram of a free-running (or astable) multivibrator constructed in accordance with this invention.

Referring to the drawing, a free-running multivibrator 60 is provided with a stabilized 12-volt supply from a battery 4 connected in series with a dropper resistor 31 and a Zener diode 32, to which are connected the positive line 98 and negative line 99 of the stabilized 12-volt supply. A reservoir capacitor 33 for high-current pulses drawn from the battery is connected in parallel with the Zener diode 32.

The free-running multivibrator 60 comprises P-N-P transistors 61 and 62 having respective emitters connected to the positive line 98 of the stabilized 12--volt supply and collectors connected to the negative line 99 of the supply by way of resistors 63 and 64. The base terminal of transistor 61 connects by way of a capacitor 66 with the collector of transistor 62. Likewise the base terminal of transistor 62 connects by way of resistor 67 with the negative side of the supply and by way of capacitor 68 with the collector of transistor 61. The periods of conduction of transistors 61 and 62 are basically determined by the respective capacitor-resistor networks 68, 67 and 66, 65.

The output voltages from the multivibrator appear at the collector of each of transistors 61 and 62 and are extracted through lines X and Y.

The periods of conduction of transistors 61 and 62 can be varied in dependence upon a variable control voltage which is variable from zero to a voltage equal to that of the 12-volt supply and which is applied to the circuit between the negative side of the 12-volt supply and the point A.

The period during which transistor 62 is conducting is reduced below its maximum by effecting more rapid discharge of capacitor 66 than can take place if that capacitor is allowed to discharge only through resistor 65. To this end there is provided a transistor 73 of the N-P-N type the collector of which is connected to the common point of capacitor 66 and the base of transistor 61 while the base of transistor 73 is connected to the control voltage point A. The emitter of transistor 73 is connected to the common point of resistors 74 and 75 which are connected across the 12-volt supply and of which resistor 75 limits the emitter and, therefore, the collector currents of transistor 73. It will be appreciated that as the control voltage increases, the base of transistor 73 which is connected as an emitter follower goes more positive and the transistor accordingly is rendered more heavily conducting with the result that capacitor 66 discharges more rapidly and the transistor 61 is switched into conduction earlier while the transistor 62 is switched into nonconduction earlier with the result that the period of conduction of transistor 62 is reduced. The minimum period of conduction of transistor 62 is limited by the resistor 75 which limits the current flow through transistor 73.

The period during which conduction through the transistor 61 takes place is reduced below its maximum by use of an N-P-N transistor 76 the collector of which is connected to the common point of capacitor 68 and the base of transistor 62 while the emitter is connected to the negative side of the 12-volt supply by way of a resistor 77. The transistor 76 which is connected as an emitter follower operates to reduce the period of conduction of transistor 61 in much the same way as transistor 73 operates to reduce the period of conduction of transistor 61, except that a further P-N-P transistor 78 is utilized to invert the control voltage. The transistor 78 has its base connected to the cathode side of a diode 79 and by way of a resistor 80 to the negative side of the 12-volt supply. The anode side of the diode 79 is connected to the control voltage point A. The emitter of transistor 78 is connected by way of a resistor 81 with the positive side of the 12-volt supply while its collector is connected with the base of transistor 76 and in series with a resistor 82 to the negative side of the supply. When the control voltage is at a minimum, resistor 80 holds transistor 78 in a conducting state and the diode 79 is reverse biased. This means that the base of transistor 76 is at a positive voltage of about 3 volts, determined by the voltage divider of resistors 81 and 82, and transistor 76 is thus in a conducting state. In this condition capacitor 68 discharges more quickly than it would ordinarily discharge through resistor 67, and transistor 61 is switched into nonconduction at the earliest moment with the result that the period of conduction of transistor 61 is at a minimum. As the control voltage increases positively above the base voltage of transistor 78, diode 79 becomes forward biased and conducts. The current through transistor 78 thus falls and the collector voltage goes more negative thereby reducing the current through transistor 76 with the result that the discharge time of capacitor 68 increases and transistor 62 switches later into conduction so increasing the period of conduction of transistor 61. The resistor 77 limits the current through the transistor 76 and so gives a definite minimum period of conduction of transistor 61.

The overall effect of the transistors 73, 76 and 78 is that as the control voltage increases from 0 to 3 volts the transistor 78 remains saturated because of resistor 80 and diode 79. Accordingly, the rate of discharge of capacitor 68 during this increase in the control voltage is unaffected. However, the transistor 73 during this increase becomes more heavily conducting so that capacitor 66 is more rapidly discharged with the result that transistor 61 has its turning on point advanced and the period of conduction of transistor 62 is reduced. As the control voltage increases further from 3 volts to its maximum value, the period of conduction of transistor 62 is further reduced and at the same time the discharge rate of capacitor 68 is progressively reduced with the result that the period of conduction of transistor 61 is increased.

The circuit includes means for reducing the period of conduction of the transistor 61 when the magnitude of a negative control voltage applied between the negative side of the supply and the point B exceeds a predetermined value. To this end there is provided an N-P-N transistor 85 the emitter of which is connected to the point B while its base is connected in series with a diode 86 to the negative side of the 12-volt supply. The transistor 85 is temperature compensated by the diode 86, the voltage across the diode 86 varying in a similar manner to the base-emitter voltage of the transistor 85. The base of the transistor 85 is connected in series with fixed resistor 87 and variable resistor 88 to the positive side of the supply. The collector of transistor 85 is connected by way of a resistor 89 with this positive side of the 12-volt supply and is further connected by a resistor 90 with the base of a P-N-P transistor 91 whose emitter is connected in series with a Zener diode 92 to the positive side of the supply while its collector is connected to the base of transistor 76. As the voltage applied at B goes more negative, the base-emitter voltage of transistor 85 increases so that the transistor 85 is switched into a conducting condition. The collector voltage of transistor 85 thus goes negative. When the voltage of the collector of the transistor 85 reaches a predetermined value the transistor 91 will begin to conduct and the voltage of the base of transistor 76 will thus go positive so that transistor 76 will become heavily conducting and more rapidly discharge capacitor 68 thereby shortening the period of conduction of transistor 61.

The described multivibrator could be used for example in a pulse generator of a pulse control system for a battery-powered electric motor, of the kind comprising a first thyristor which when switched into a conducting state connects the motor to the battery, a commutating capacitor, and a second thyristor which when switched into a conducting condition permits the commutating capacitor to reverse bias and so switch off the first thyristor to disconnect the motor from the battery. Thus the output voltage from transistor 61 can be applied through a capacitor to a suitable amplifier to supply "on" voltage pulses to the gate of the first thyristor, while the output of transistor 62 can be similarly used to supply "off" voltage pulses to the gate of the second thyristor. Then as the control voltage applied at A to the multivibrator is raised, transistor 61 is switched into conduction earlier so that the "on" pulses to the first thyristor are supplied earlier. At the same time (when the control voltage exceeds 3 volts) transistor 62 is switched into conduction later so that the "off" pulses to the second thyristor, which acts to switch off the first thyristor, are delayed. The result is that as the control voltage is raised, the mark-space ratio of the current supplied to the motor increases, so that the mean current through the motor increases. The control voltage could be taken, for example, from a potentiometer coupled to the accelerator pedal of a vehicle driven by the motor. The negative control voltage applied at B could be taken from a current-sensing resistor in series with the battery and the motor, variable resistor 88 being adjusted so that the voltage at which transistor 91 will be rendered conducting to switch transistor 62 into conduction at the earliest possible moment corresponds to the voltage across the current-sensing resistor when the current through the motor is at a desired maximum value. Thus when the current through the motor reaches a maximum value, the "off" pulse to the second thyristor will be supplied earlier, thus reducing the mark-space ratio of the current through the motor, and effectively limiting the motor current to a safe value.

It will be apparent that many modifications could be made in the described embodiment. For instance, transistor means could be provided for varying the period of conduction of only one of the transistors 61 and 62, the period of conduction of the other being allowed to remain constant. Alternatively, the periods of conduction of the two transistors 61 and 62 could be varied in dependence upon two separate control voltages applied to respective transistor means. The invention could be applied to a monostable multivibrator, the control voltage varying the period of conduction of the transistor which is in a conduction condition during the semistable mode of the multivibrator.

I claim:

1. A multivibrator including first and second transistors at least one of which has connected therewith a resistor-capacitor network comprising a capacitor and resistor means through which, in operation, capacitor current flows during the period of conduction of the associated transistor, the rate of change of the charge on the capacitor determining the length of said period of conduction of the transistor, wherein there are provided semiconductor means (73 or 76) connected with the said resistor-capacitor network (65, 66 or 67, 68) and providing in parallel with said resistor means (65 or 67) a further path for the capacitor current, the semiconductor means being operable, in dependence upon a control voltage (A) applied thereto, to vary the rate of the change of charge on said capacitor during the period of conduction of the associated transistor thereby to vary the length of said period of conduction of the associated transistor.

2. A multivibrator as claimed in claim 1 and of the free-running kind having first and second resistor-capacitor networks connected respectively with the first and second transistors and each comprising a capacitor and resistor means, wherein there are provided first and second semiconductor means (73 and 76) connected respectively with the first and second resistor-capacitor networks (65, 66 and 67, 68), each semiconductor means providing, in parallel with the resistor means of the associated resistor-capacitor network, a further capacitor path, and each being operable, in dependence upon a control voltage (A) applied thereto, to vary the rate of change of the charge on the capacitor (66 or 68) of the associated resistor-capacitor network, whereby the period of conduction of the associated transistor (61 or 62) is varied.

3. A multivibrator as claimed in claim 2, wherein the first and second semiconductor means (73 and 76) are operable in dependence upon the same control voltage, the first semiconductor means (73) being rendered increasingly heavily conducting upon rise in the control voltage thereby to increase the rate of change of charge on the capacitor (66) of the first resistor-capacitor network (65, 66), while the second semiconductor means (76) is rendered less heavily conducting upon rise in the control voltage thereby to decrease the rate of change of charge on the capacitor (68) of the second resistor-capacitor network (67, 68).

4. A multivibrator as claimed in claim 1, wherein further control means are provided including a transistor (85) responsive to a further control voltage (B), the output of the transistor being used to operate one of the semiconductor means (76) to vary the rate of change of charge on the capacitor (68) of the associated resistor-capacitor network (67, 68) when the magnitude of the further control voltage exceeds a predetermined value.

5. A multivibrator as claimed in claim 4, wherein the transistor (85) responsive to the further control voltage is temperature compensated by the provision of a diode (86) the voltage across which varies in a similar manner to the base-emitter voltage of the transistor (85).

6. A multivibrator as claimed in claim 1 wherein the semiconductor means (73 or 76) comprises transistor means.

7. A multivibrator as claimed in claim 6 wherein the transistor means (73 or 76) comprises an N-P-N transistor the collector-emitter path of which is connected in series with the capacitor (66 or 68) of the associated resistor-capacitor network (65, 66 or 67, 68), the base-emitter bias voltage of the said N-P-N transistor being dependent on the control voltage (A).

8. A multivibrator as claimed in claim 7, wherein the control voltage is applied to the base of the said N-P-N transistor of the transistor means (73), so that a rise in the control voltage causes the transistor to conduct more heavily.

9. A multivibrator as claimed in claim 7, in which the control voltage is used to control the collector current of a P-N-P transistor and the base of the said N-P-N transistor (76) of the transistor means is connected to the junction of the collector of the P-N-P transistor and a resistor (82) in series with the collector-emitter path of the P-N-P transistor so that a rise in the control voltage causes a decrease in the potential of the base of the said N-P-N transistor (76) of the transistor means to render it less heavily conducting.

UNITED STATES PATENT OFFICE
CERTIFICATE OF CORRECTION

Patent No. 3,587,002 Dated June 22, 1971

Inventor(s) Christopher Robin Brown

It is certified that error appears in the above-identified patent and that said Letters Patent are hereby corrected as shown below:

Column 1 line 52
Insert "a resistor 65 with the negative side of the supply and by way of " after -- by way of--

Signed and sealed this 2nd day of November 1971.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
★ U.S. GOVERNMENT PRINTING OFFICE : 1969 O—366-334